(12) United States Patent
Micielli et al.

(10) Patent No.: US 10,153,768 B1
(45) Date of Patent: Dec. 11, 2018

(54) INTEGRATED CIRCUITRY AND METHODS FOR REDUCING LEAKAGE CURRENT

(71) Applicant: NXP USA, Inc., Austin, TX (US)

(72) Inventors: Christopher James Micielli, Austin, TX (US); Srikanth Jagannathan, Austin, TX (US); Hector Sanchez, Austin, TX (US); Kumar Abhishek, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/908,255

(22) Filed: Feb. 28, 2018

(51) Int. Cl.
*H03K 17/00* (2006.01)
*H03K 17/687* (2006.01)
*H03K 17/16* (2006.01)

(52) U.S. Cl.
CPC ....... *H03K 17/6872* (2013.01); *H03K 17/162* (2013.01); *H03K 2217/9605* (2013.01)

(58) Field of Classification Search
None
See application file for complete search history.

(56) References Cited

U.S. PATENT DOCUMENTS

| | | | |
|---|---|---|---|
| 5,570,043 A | 10/1996 | Churchill | |
| 5,576,635 A | 11/1996 | Partovi et al. | |
| 6,163,199 A | 12/2000 | Miske et al. | |
| 7,098,694 B2 | 8/2006 | Bhattacharya et al. | |
| 8,018,268 B1 | 9/2011 | Williams | |
| 9,621,156 B2 * | 4/2017 | Aherne | H03K 17/6872 |
| 2002/0067199 A1 * | 6/2002 | Martini | H03K 17/162 327/365 |
| 2014/0049861 A1 | 2/2014 | Gagne et al. | |

* cited by examiner

*Primary Examiner* — Long Nguyen

(57) ABSTRACT

Input/output circuitry includes a first PMOS device and a first NMOS device having first current electrodes are connected to each other and a pad. First selection circuitry, when the I/O circuitry is disabled, provides a first supply voltage to a control electrode and an N-well of the first PMOS device when the pad voltage is between the first and second supply voltages and to directly provide the pad voltage to the control electrode and the N-well of the first PMOS device when the pad voltage is greater than the first supply voltage. Similarly, second selection circuitry, when the I/O circuitry is disabled, provides a second supply voltage or directly provides the pad voltage to a control electrode and a P-well of the first NMOS device depending on whether the pad voltage is between the first and second supply voltages or less than the second supply voltage, respectively.

20 Claims, 9 Drawing Sheets

| I/O_CIRCUIT_ENABLE | PAD VOLTAGE | PGATE | N-WELL | NGATE | P-SUB |
|---|---|---|---|---|---|
| 1 | X | VSS | VDD | VDD | VSS |
| 0 | < VSS | VDD | VDD | PAD | PAD |
| 0 | VSS < PAD < VDD | VDD | VDD | VSS | VSS |
| 0 | > VDD | PAD | PAD | VSS | VSS |

FIG. 2

INTEGRATED CIRCUITRY AND METHODS FOR REDUCING LEAKAGE CURRENT

BACKGROUND

Field

This disclosure relates generally to integrated circuitry, and more specifically, to circuitry that is tolerant of negative and over-voltage conditions to reduce unwanted leakage current.

Related Art

Voltage levels on printed circuit boards are often different than those used in components mounted on the board, such as a system-on-chip semiconductor die. One component of injection current is comprised of core/supply leakage current through the pad into the processing core of the SoC, leaving the processing core exposed to injection current. Another component of leakage current is bulk leakage current through the substrate/N-well. Injection current into the semiconductor die can result in undesired effects on performance. For example, when the input/output (I/O) circuitry is supposed to be OFF, but voltage at an I/O pad reaches a threshold voltage above the I/O supply, the I/O circuitry is inadvertently turned ON causing injection current.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

FIG. 2 illustrates examples various combinations of voltages used in the integrated circuit of FIG. 1.

DETAILED DESCRIPTION

Embodiments of integrated circuits disclosed herein provide protection during over-voltage and negative-voltage conditions. Over and under-voltage conditions are detected by comparing I/O pad voltage to supply voltages VDD and VSS. Typically, when the I/O pad is in an off condition, the control electrode and body (NWELL) terminal of a P-channel transistor of the I/O pad circuitry is connected to supply voltage VDD. The gate and body of an N-channel transistor of the I/O pad circuitry is connected to supply voltage VSS. In this method, when the I/O pad is in an off condition, the gate and N-well of a P-channel transistor is connected to a maximum of VDD or I/O pad voltage, and the gate and substrate of an N-channel transistor is connected to a minimum of VSS or I/O pad voltage. The drain-source and drain-body leakage path through the P-channel transistor and N-channel transistor is eliminated and injection current from an I/O pad to a node coupled to a processing core, VDD, and VSS is greatly reduced. In addition, operational characteristics such as ON resistance, harmonic distortion, and signal-to-noise ratio are improved.

Figure 1:
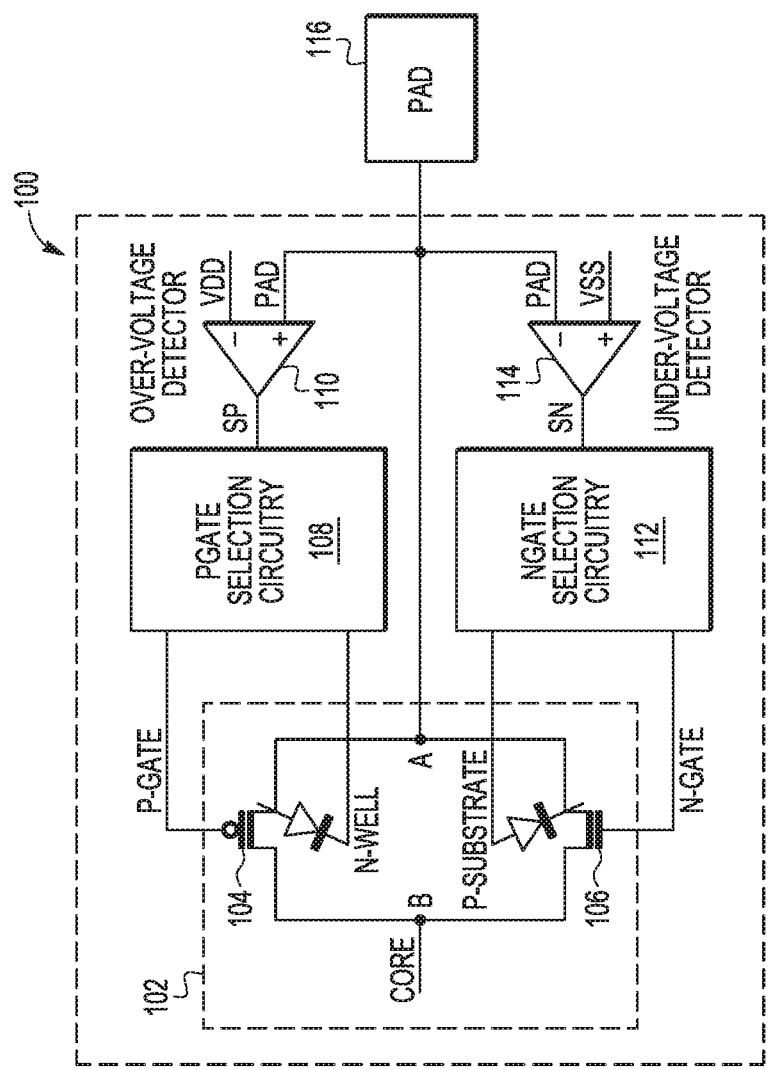
FIG. 1 illustrates a block diagram of an integrated circuit with over and under-voltage detection and protection in accordance with selected embodiments of the invention.

FIG. 1 illustrates a block diagram of an integrated circuit (IC) 100 with over and under-voltage detection and protection in accordance with selected embodiments of the invention. In the example shown, IC 100 includes input/output (I/O) circuitry (also referred to as a transmission gate) 102 with P-channel transistor 104 and N-channel transistor 106, P-gate selection circuitry 108, over voltage detection circuit 110, N-gate selection circuitry 112, under-voltage detector 114, and I/O pad 116. I/O pad 116 is coupled to a non-negating input of over voltage detector 110, a negating input of under-voltage detector 114, and source electrodes of P-channel transistor 104 and N-channel transistor 106. The source electrodes of P-channel transistor 104 and N-channel transistor 106 are coupled to one another at node A. The drain electrodes of P-channel transistor 104 and N-channel transistor 106 are coupled to one another at node B. Voltage at node B is provided or coupled to a core processor.

Over voltage detection circuit 110 includes a negating input coupled to VDD and an output coupled to P-gate selection circuitry 108. Under-voltage detector 114 includes a non-negating input coupled to VSS and an output coupled to N-gate selection circuitry 112. P-gate selection circuitry 108 outputs a P-gate signal that is coupled to the control electrode of P-channel transistor 104 and an N-well signal that is coupled to an N-well in which P-channel transistor 104 is formed. N-gate selection circuitry 112 outputs an N-gate signal that is coupled to the control electrode of N-channel transistor 106 and a P-substrate signal that is coupled to a substrate doped with P-type material in which N-channel transistor 106 is formed.

Referring to FIGS. 1 and 2, FIG. 2 is a table that shows when the I/O_circuit_enable signal is asserted, P-gate selection circuitry 108 outputs P-gate signal equal to VSS and N-well signal equal to VDD. N-gate selection circuitry 112 outputs N-gate signal equal to VDD and P-substrate signal equal to VSS. The outputs of P-gate selection circuitry 108 and N-gate selection circuitry 112 remain the same regardless of the voltage at pad 116. When the I/O_circuit_enable signal is de-asserted, during an over-voltage condition with the voltage at I/O pad 116 greater than VDD the P-gate selection circuitry 108 outputs the voltage of I/O pad 116 and during an under-voltage condition with voltage at I/O pad less than VSS, the N-gate selection circuitry 112 outputs the voltage of I/O pad 116.

During the under-voltage condition, the voltage at pad 116 is less than supply voltage VSS. To reduce or eliminate body leakage in N-channel transistor 106, N-gate selection circuitry 112 outputs N-gate and P-substrate signals equal to the I/O pad voltage. P-gate signal and N-well signal from P-gate selection circuitry 108 are equal to VDD.

During the over-voltage condition, the voltage at pad 116 is greater than supply voltage VDD. To reduce or eliminate body leakage in P-channel transistor 104, P-gate signal and N-well signal from P-gate selection circuitry 108 are equal to the I/O pad voltage. N-gate selection circuitry 112 outputs N-gate and P-substrate signals equal to supply voltage VSS.

When the voltage at I/O pad 116 is between VSS and VDD, P-gate selection circuitry 108 outputs P-gate and N-well signals equal to VDD. N-gate selection circuitry 112 outputs N-gate and P-substrate signals equal to VSS.

Figure 3:
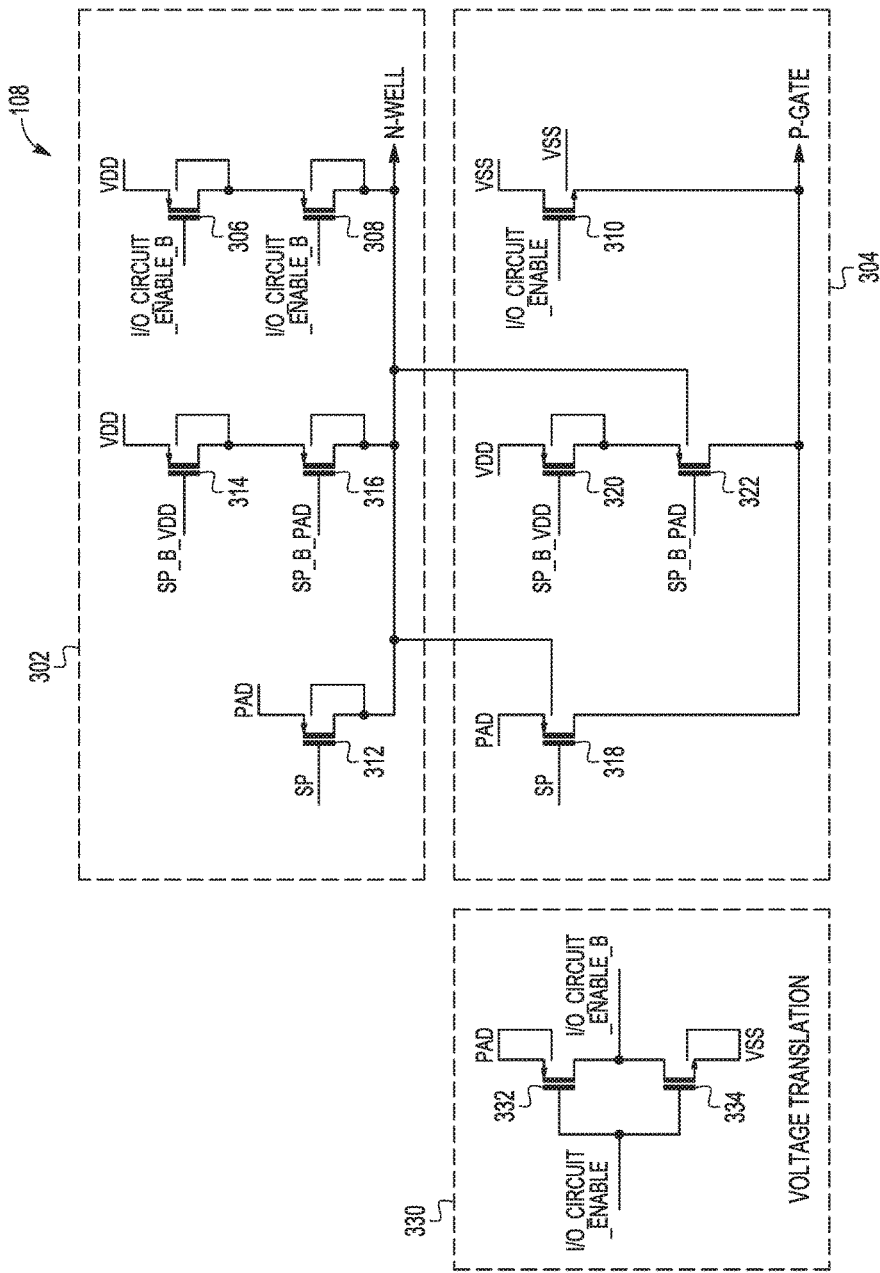
FIG. 3 illustrates a schematic diagram of an embodiment of a P-gate selection circuit that can be used in the integrated circuit of FIG. 1.

FIG. 3 illustrates a schematic diagram of an embodiment of a P-gate selection circuit 108 that can be used in the integrated circuit 100 of FIG. 1 and includes N-well signal circuitry 302, P-gate signal circuitry 304, and voltage translation circuitry 330.

Voltage translation circuitry 330 includes an inverter with P-channel transistor 332 and N-channel transistor 334. P-channel transistor 332 includes a source electrode coupled to I/O pad 116 (FIG. 1), a control electrode coupled to I/O_circuit_enable signal, and a drain electrode coupled to a drain electrode of N-channel transistor 334. N-channel transistor 334 further includes a control electrode coupled to the I/O_circuit_enable signal and a source electrode coupled to VSS (or ground). An output of voltage translation circuitry 330 is provided at a node where the drain electrode of P-channel transistor 332 is coupled to the drain electrode of N-channel transistor 334 and is labeled as I/O_circuit_enable_b.

N-well signal circuitry 302 includes P-channel transistors 306, 308, 312, 314, 316. P-channel transistor 312 includes a source electrode coupled to I/O pad voltage, a control electrode coupled to an Sp signal, which is generated by over-voltage detection circuit 110 (See FIG. 4), and a drain electrode coupled to a body terminal of transistor 312. The drain electrode of P-channel transistor is also coupled to the drain electrodes of P-channel transistors 308, 316 and N-well of 318. The N-well signal at the junction of the drain electrodes of P-channel transistors 308, 316 and 312 is provided to the N-well of P-channel transistor 104 in I/O circuitry 102 (FIG. 1).

P-channel transistor 314 includes a source electrode coupled to supply voltage VDD, a control electrode coupled to Sp_b_VDD signal, which is generated by over-voltage detection circuit 110 (See FIG. 4), and a drain electrode coupled to a source electrode of P-channel transistor 316. The drain electrode of P-channel transistor 314 is also coupled to a body terminal of transistor 314.

P-channel transistor 316 further includes a control electrode coupled to Sp_b_pad signal, which is generated by over-voltage detection circuit 110 (See FIG. 4), and a drain electrode coupled to the drain electrodes of P-channel transistors 312 and 308, which provide the N-well signal.

P-channel transistor 306 includes a source electrode coupled to supply voltage VDD, a control electrode coupled to a complement of I/O_circuit_enable signal (I/O_circuit_enable_b), and a drain electrode coupled to a source electrode of P-channel transistor 308. The drain electrode of P-channel transistor 306 is also coupled to a body terminal of transistor 306.

P-channel transistor 308 further includes a control electrode coupled to the I/O_circuit_enable_b signal and a drain electrode coupled to the drain electrodes of P-channel transistors 312 and 316, which provides the N-well signal.

P-well voltage circuitry 304 includes N-channel transistor 310 and P-channel transistors 318, 320, 322. P-channel transistor 318 includes a source electrode coupled to pad voltage, a control electrode coupled to Sp signal, which is generated by over-voltage detection circuit 110 (See FIG. 4), and a drain electrode coupled to the drain electrode of P-channel transistor 322 and the source electrode of N-channel transistor 310. The P-gate signal at the junction of the drain electrodes of P-channel transistors 318 and 322 and the source electrode of N-channel transistor 310 is provided to the control electrode P-channel transistor 104 in I/O circuitry 102 (FIG. 1). The body terminal of P-channel transistor 318 is coupled to the N-well signal.

P-channel transistor 320 includes a source electrode coupled to supply voltage VDD, a control electrode coupled to Sp_b_VDD signal, which is generated by over-voltage detection circuit 110 (See FIG. 4), and a drain electrode coupled to a source electrode of P-channel transistor 322. The drain electrode of P-channel transistor 320 is also coupled to a body terminal of transistor 320.

P-channel transistor 322 further includes a control electrode coupled to Sp_b_pad signal, which is generated by over-voltage detection circuit 110 (See FIG. 4), and a drain electrode coupled to the drain electrode of P-channel transistor 318 and the source electrode of N-channel transistor 310. The body terminal of P-channel transistor 322 is coupled to the N-well signal.

N-channel transistor 310 includes a drain electrode coupled to supply voltage VSS, a control electrode coupled to the I/O_circuit_enable signal (I/O_circuit_enable), and a source electrode coupled to the drain electrodes of P-channel transistors 318 and 322.

During operation of N-well signal circuitry 302, when the I/O_circuit_enable signal is de-asserted and the voltage at I/O pad 116 is between VDD and VSS, the Sp_b_pad, and Sp_b_vdd signals provided by over-voltage detector circuit 110 (FIG. 4) will be low and Sp be VDD causing transistors 314, 316 to be in conducting mode and 312 to be in non-conducting mode. I/O_circuit_enable_b signal will be high causing transistors 306 and 308 to be in non-conducting mode. The N-well signal output by N-well signal circuitry 302 will be VDD. When the I/O_circuit_enable signal is de-asserted and the voltage at I/O pad 116 is greater than VDD, the N-well signal is the maximum of VDD and the pad voltage. When the I/O_circuit_enable signal is asserted, transistors 312-316 are in non-conducting mode, transistors 306 and 308 are in conducting mode, and the N-well signal is set to VDD.

During operation of P-gate signal circuitry 304, when the I/O_circuit_enable signal is de-asserted and the voltage at I/O pad 116 is between VDD and VSS, the Sp_b_pad, and Sp_b_vdd signals provided by over-voltage detector circuit 110 (FIG. 4) will be low and Sp be VDD causing transistors 320, 322 to be in conducting mode and transistor 318 to be in non-conducting mode. The P-gate signal output by P-gate signal circuitry 304 will be VDD. When the I/O_circuit_enable signal is de-asserted and the voltage at I/O pad 116 is greater than VDD, the P-gate signal is the maximum of VDD and the pad voltage. When the I/O_circuit_enable signal is asserted, transistors 318, 320 and 322 are in non-conducting mode, transistor 310 is in conducting mode, and the P-gate signal is set to VSS.

During operation of N-well signal circuitry 302, when the I/O_circuit_enable signal is not asserted and the voltage at I/O pad 116 is between VDD and VSS, the Sp, Sp_b_pad, and Sp_b_vdd signals provided by over-voltage detector circuit 110 (FIG. 4) will be low and transistors 312, 314, 316 will be in conducting mode. I/O_circuit_enable_b signal will be high placing transistors 306 and 308 in non-conducting mode. The N-well signal output by N-well signal circuitry 302 will be VDD. When the I/O_circuit_enable signal is not asserted and the voltage at I/O pad 116 is greater than VDD, the N-well signal is the maximum of VDD and the pad voltage. When the voltage at I/O pad 116 is less than VSS, the N-gate signal is the minimum of VSS and the pad voltage. When the I/O_circuit_enable signal is asserted, transistors 312-316 are in non-conducting mode, transistors 306 and 308 are in conducting mode, and the N-well signal is set to VDD.

During operation of the P-gate signal circuitry 304, when the I/O_circuit_enable signal is not asserted and the voltage at I/O pad 116 is between VDD and VSS, the Sp, Sp_b_pad, and Sp_b_vdd signals provided by over-voltage detector circuit 110 (FIG. 4) will be low, transistors 318, 320, 322 will be in conducting mode and transistor 310 will be in non-conducting mode. The P-gate signal output by P-gate signal circuitry 304 will be VDD. When the I/O_circuit_enable signal is not asserted and the voltage at I/O pad 116 is greater than VDD, the P-gate signal is the maximum of VDD and the pad voltage. When the voltage at I/O pad 116 is less than VSS, the P-gate signal is the minimum of VSS and the pad voltage. When the I/O_circuit_enable signal is asserted, transistors 318-322 are in non-conducting mode, transistor 310 is in conducting mode, and the P-gate signal is set to VSS.

Figure 4:
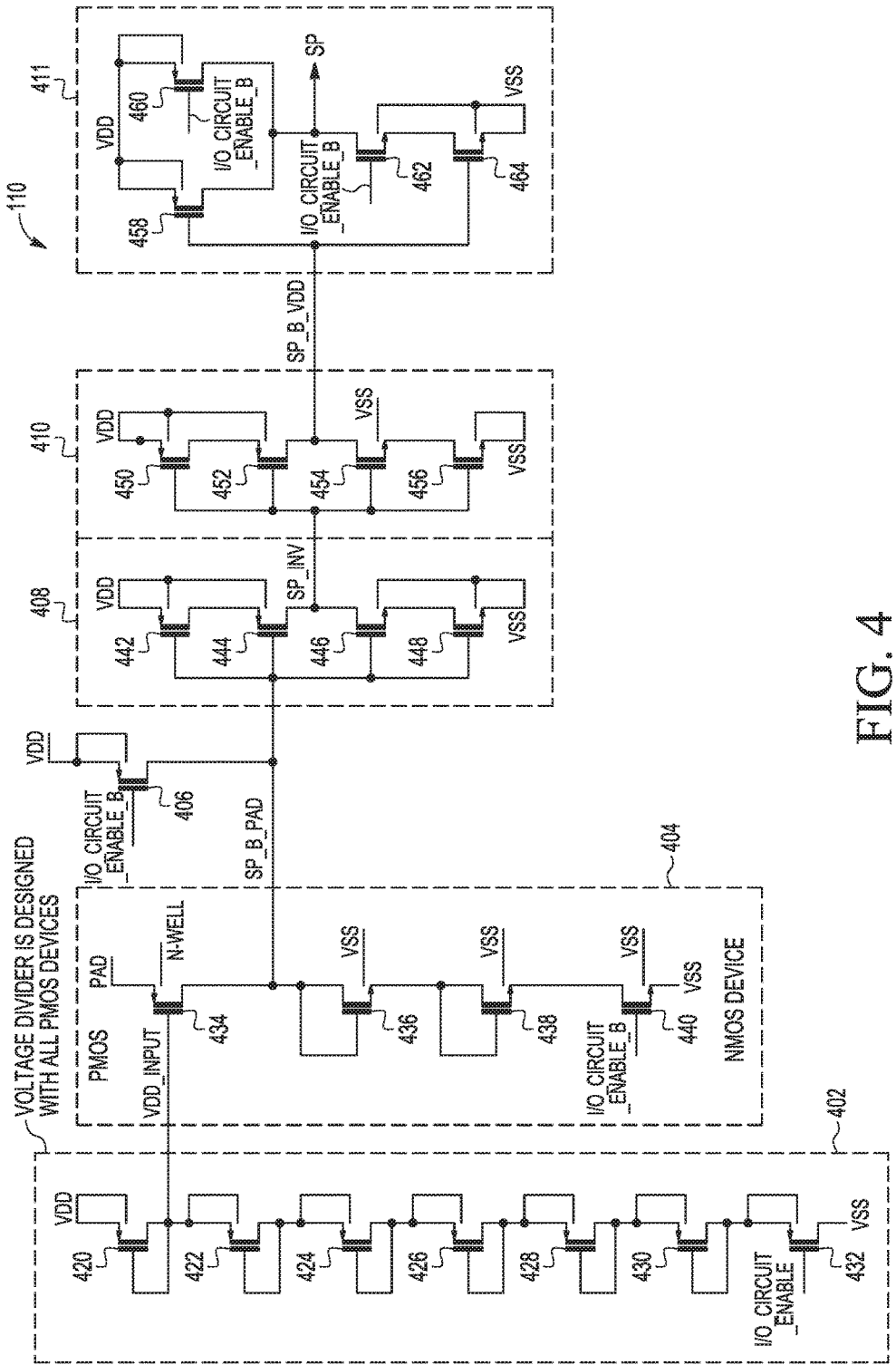
FIG. 4 illustrates a schematic diagram of an embodiment of a comparator for an over-voltage detection circuit that can be used in the integrated circuit of FIG. 1.

FIG. 4 illustrates a schematic diagram of an embodiment over-voltage detection circuit 110 that can be used in the integrated circuit 100 of FIG. 1 including voltage divider circuit 402, selection circuit 404, inverter circuits 408, 410, and output logic circuit 411. Voltage divider circuit 402 includes P-channel transistors 420, 422, 424, 426, 428, 430, and 432 connected in series. A source electrode and a body terminal of P-channel transistor 402 are coupled to supply voltage VDD. Control electrodes of P-channel transistors 420-430 are coupled to respective drain electrodes of P-channel transistors 420-432. A control electrode of P-channel transistor 432 is coupled to the I/O_circuit_enable_b signal. Drain electrodes of P-channel transistors 420-432 are further coupled to source electrodes of an adjacent one of P-channel transistors 422-430. A drain electrode of P-channel transistor 432 is coupled to supply voltage VSS. Body terminals of P-channel transistors 422-432 are coupled to the corresponding source electrodes of P-channel transistors 422-432. Note the output from voltage divider circuit 402 can be tapped at a drain electrode of any one of P-channel transistors 420-432 depending on the margin between the pad voltage and supply voltages VDD and VSS at which the comparison for under and over-voltage conditions are selected to begin. Additionally, voltage divider circuit 402 can include fewer or more P-channel transistors 420-432, depending on the level of current desired. N-channel transistors can alternatively be used instead of P-channel transistors 420-432 with a corresponding change in using the complement of the I/O_circuit_enable signal instead of the I/O_circuit_enable_b signal. A resistor network could also be used to implement the divider circuit.

Selection circuit 404 includes P-channel transistor 434 coupled in series with N-channel transistors 436, 438, 440 forming the load. An input voltage (VDD_input) is provided to a control electrode of P-channel transistor 434 is an output of voltage divider circuit 402. P-channel transistor 434 further includes a source electrode coupled to the pad voltage, a body terminal coupled to the N-well signal, and a drain electrode coupled to a drain electrode of N-channel transistor 436. N-channel transistor 436 further includes a control electrode coupled to the drain electrode of N-channel transistor 436, a body terminal coupled to supply voltage VSS, and a source electrode coupled to a drain electrode of N-channel transistor 438. N-channel transistor 438 further includes a control electrode coupled to the drain electrode of N-channel transistor 438, a body terminal coupled to supply voltage VSS, and a source electrode coupled to a drain electrode of N-channel transistor 440. N-channel transistor 440 further includes a control electrode coupled to the complement of the I/O_circuit_enable signal (I/O_circuit_enable_b), and a body terminal and a source electrode coupled to supply voltage VSS.

An output of selection circuit 404 shown as Sp_b_pad signal is tapped at the drain electrode of P-channel transistor 434 and will be either the pad voltage or supply voltage VSS, depending on whether the pad voltage is greater than supply voltage VDD and the I/O_circuit_enable signal is high or low, as explained in more detail in the description for FIG. 2 herein. P-channel transistor 406 includes a source electrode coupled to supply voltage VDD, a control electrode coupled to a complement of the I/O_circuit_enable signal (I/O_circuit_enable_b), and a drain electrode coupled between the output of selection circuit 404 and an input to inverter circuit 408.

Inverter circuit 408 includes P-channel transistors 442, 444 and N-channel transistors 446, 448. P-channel transistor 442 includes a source electrode and body terminal coupled to supply voltage VDD, a control electrode coupled to the output of selection circuit 404 (Sp_b_pad signal), and a drain electrode coupled to a source electrode of P-channel transistor 444. P-channel transistor 444 further includes a control electrode coupled to the output of selection circuit 404 (Sp_b_pad signal), a body terminal coupled to supply voltage VDD, and a drain electrode coupled to a drain electrode of N-channel transistor 446. N-channel transistor 446 further includes a control electrode coupled to the output of selection circuit 404 (Sp_b_pad signal), a body terminal coupled to supply voltage VSS, and a source electrode coupled to a drain electrode of N-channel transistor 448. N-channel transistor 448 further includes a control electrode coupled to the output of selection circuit 404 (Sp_b_pad signal), and a body terminal and a source electrode coupled to supply voltage VSS.

An output signal of inverter circuit 408 (labeled as Sp_inv) is the complement of the output of selection circuit 404 (Sp_b_pad signal).

Inverter circuit 410 includes P-channel transistors 450, 452 and N-channel transistors 454, 456. P-channel transistor 450 includes a source electrode and body terminal coupled to supply voltage VDD, a control electrode coupled to the output of inverter circuit 408 (Sp_inv signal), and a drain electrode coupled to a source electrode of P-channel transistor 452. P-channel transistor 452 further includes a control electrode coupled to the output of inverter circuit 408 (Sp_inv signal), a body terminal coupled to supply voltage VDD, and a drain electrode coupled to a drain electrode of N-channel transistor 454. N-channel transistor 454 further includes a control electrode coupled to the output of inverter circuit 408 (Sp_inv signal), a body terminal coupled to supply voltage VSS, and a source electrode coupled to a drain electrode of N-channel transistor 456. N-channel transistor 456 further includes a control electrode coupled to the output of inverter circuit 408 (Sp_inv signal), and a body terminal and a source electrode coupled to supply voltage VSS.

An output signal of inverter circuit 410 (labeled as Sp_b_vdd) is the complement of the output of inverter circuit 408 (Sp_inv signal).

Output logic circuit 411 includes P-channel transistors 458, 460 and N-channel transistors 462, 464 configured as a NAND logic gate. Source electrodes of P-channel transistors 458, 460 are coupled to supply voltage VDD and drain electrodes of P-channel transistors 458, 460 are coupled to one another and to a drain electrode of N-channel transistor 462. Control electrodes of P-channel transistor 458 and of N-channel transistor 464 are coupled to the output of inverter circuit 410 (Sp_b_vdd). Control electrodes of P-channel transistor 460 and of N-channel transistor 462 are coupled to a complement of the I/O_circuit_enable signal (I/O_circuit_enable_b). A source electrode of N-channel transistor 462 is coupled to a drain electrode of N-channel transistor 464. A source electrode and the body terminal of N-channel transistor 464 is coupled to supply voltage VSS. An output signal (Sp) of over-voltage detector circuit 110 is tapped between the drain electrodes of P-channel transistors 458 and 460 and the drain electrode of N-channel transistor 462.

During operation of over-voltage detector circuitry 110, when the I/O_circuit_enable signal is de-asserted, transistors 432, 440, and 462 are conducting. Sp_b_pad signal is set low (VSS) unless the pad voltage is greater than supply voltage VDD, in which case the Sp_b_pad signal is at I/O pad 116 voltage level and the output Sp signal will be low. Inverter circuits 408, 410 sharpen the rising and falling edges of the Sp_b_pad signal, and the output of inverter circuit 410 is provided to the control electrodes of transistors 458 and 464. If the Sp_b_vdd signal is high and I/O_circuit_enable signal is low, the Sp signal will be low. Otherwise, if the Sp_b_vdd and I/O_circuit_enable signals are both low, the Sp signal will be high. When the I/O_circuit_enable signal is asserted, transistors 432, 440 and 462 are not conducting, transistors 406 and 460 are conducting, and the value of the output Sp signal will be high.

Figure 5:
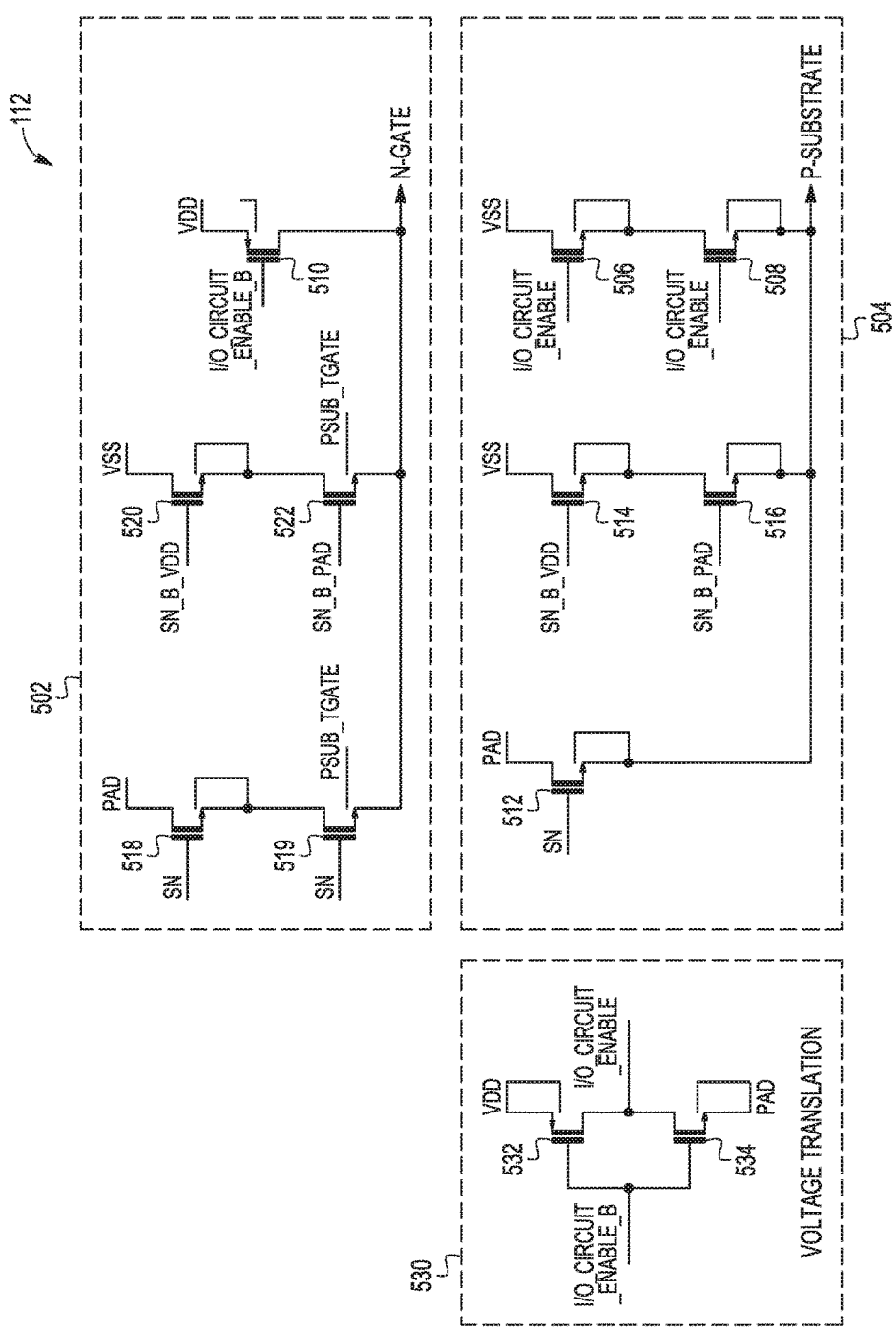
FIG. 5 illustrates a schematic diagram of an embodiment of a N-gate selection circuit that can be used in the integrated circuit of FIG. 1.
Figure 6:
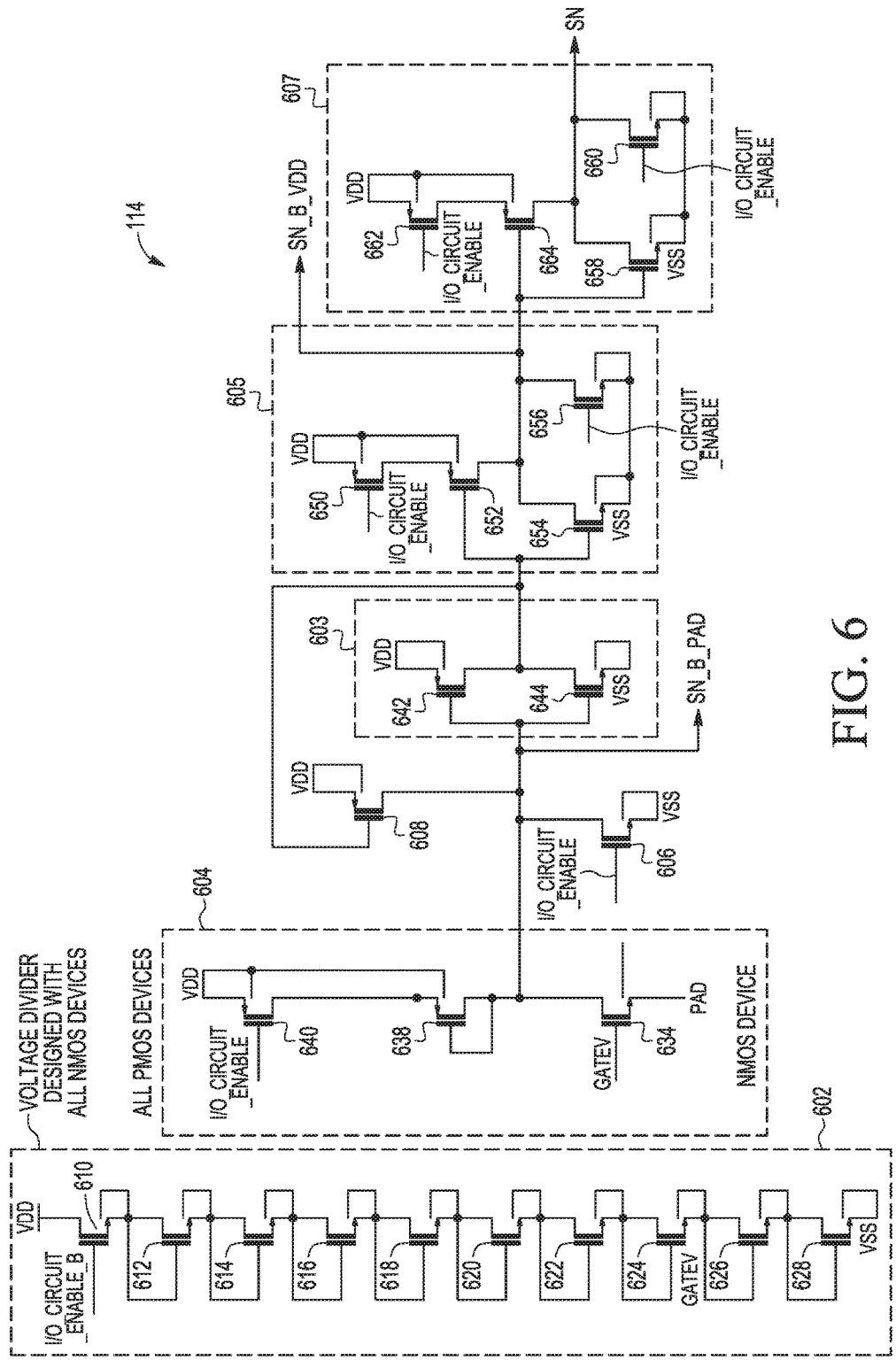
FIG. 6 illustrates a schematic diagram of an embodiment of a comparator for an under-voltage detection circuit that can be used in the integrated circuit of FIG. 1.

FIG. 5 illustrates a schematic diagram of an embodiment of a N-gate selection circuit 112 that can be used in the integrated circuit 100 of FIG. 1 that includes N-gate circuitry 502, P-substrate circuitry 504, and voltage translation circuitry 530. N-gate circuitry 502 includes N-channel transistors 518, 519, 520, 522, and P-channel transistor 510. N-channel transistor 518 includes a drain electrode coupled to pad voltage, a control electrode coupled to a Sn (select n) signal generated by under-voltage detect circuit 114, as shown in FIG. 6, and a source electrode coupled to a drain electrode of N-channel transistor 519. A control electrode of N-channel transistor 519 is coupled to the Sn signal, and a source electrode of N-channel transistor 519 is coupled to a source electrode of N-channel transistor 522 and a drain electrode of P-channel transistor 510 where the output of N-gate circuitry 502, shown as the N-gate signal, is provided. A body terminal of N-channel transistor 519 is coupled to P-substrate signal generated by P-substrate circuit 504.

Voltage translation circuitry 530 includes an inverter with P-channel transistor 532 and N-channel transistor 534. P-channel transistor 532 includes a source electrode coupled to supply voltage VDD, a control electrode coupled to the complement of the I/O_circuit_enable (I/O_circuit_enable_b) signal, and a drain electrode coupled to a drain electrode of N-channel transistor 534. N-channel transistor 534 further includes a control electrode coupled to the I/O_circuit_enable_b signal and a source electrode coupled to pad voltage on I/O pad 116 (FIG. 1). An output signal of voltage translation circuitry 530 is provided at a node where the drain electrode of P-channel transistor 532 is coupled to the drain electrode of N-channel transistor 534 and is labeled as I/O_circuit_enable.

N-channel transistor 520 includes a drain electrode coupled to supply voltage VSS, a control electrode coupled to a Sn_b_vdd signal generated by under-voltage detect circuit 114, as shown in FIG. 6, and a source electrode coupled to a drain electrode of N-channel transistor 522. A control electrode of N-channel transistor 522 is coupled to a Sn_b_pad signal generated by under-voltage detect circuit 114, as shown in FIG. 6, and a source electrode of N-channel transistor 522 is coupled to the source electrode of N-channel transistor 519 and the drain electrode of P-channel transistor 510 where the N-gate signal is provided. A body terminal of N-channel transistor 522 is coupled to P-substrate signal generated by P-substrate circuit 504.

P-channel transistor 510 includes a source electrode coupled to supply voltage VDD, a control electrode coupled to the I/O_circuit_enable_b signal, and a drain electrode coupled to the source electrodes of N-channel transistors 519 and 522 where the N-gate signal is provided.

P-substrate circuitry 504 includes N-channel transistors 512, 514, 516, 506, and 508. N-channel transistor 512 includes a drain electrode coupled to pad voltage, a control electrode coupled to the Sn signal generated by under-voltage detect circuit 114, and a source electrode coupled to the source electrodes of N-channel transistors 516 and 508 where the P-substrate signal is provided.

N-channel transistor 514 includes a drain electrode coupled to supply voltage VSS, a control electrode coupled to a Sn_b_vdd signal generated by under-voltage detect circuit 114, as shown in FIG. 6, and a source electrode coupled to a drain electrode of N-channel transistor 516. A control electrode of N-channel transistor 516 is coupled to a Sn_b_pad signal generated by under-voltage detect circuit 114, as shown in FIG. 6, and a source electrode of N-channel transistor 516 is coupled to the source electrodes of N-channel transistors 512 and 508 where the P-substrate signal is provided.

N-channel transistor 506 includes a drain electrode coupled to supply voltage VSS, a control electrode coupled to the I/O_circuit_enable signal, and a source electrode coupled to a drain electrode of N-channel transistor 508, a control electrode of N-channel transistor 508 is coupled to the I/O_circuit_enable signal. A control electrode of N-channel transistor 508 is coupled to the I/O_circuit_enable signal, and a source electrode of N-channel transistor 508 is coupled to source electrodes of N-channel transistors 512 and 516 where the P-substrate signal is provided.

During operation of N-gate signal circuitry 502, when the I/O_circuit_enable signal is de-asserted and the voltage at I/O pad 116 is between VDD and VSS, the Sn signal provided by under-voltage detector circuit 114 (FIG. 6) will be low and transistors 518 and 519 will be in non-conducting mode. The Sn_b_vdd and Sn_b_pad signals will be high placing respective N-channel transistors 520 and 522 in conductive mode.

I/O_circuit_enable_b signal will be high placing P-channel transistor 510 in non-conducting mode. The N-gate signal output by N-gate signal circuitry 502 will be VSS. When the I/O_circuit_enable signal is de-asserted and the voltage at I/O pad 116 is less than VSS, the N-gate signal equals the pad voltage. When the voltage at I/O pad 116 is greater than VDD, the N-gate signal is VSS. When the I/O_circuit_enable signal is asserted, transistor 510 is in conducting mode and transistors 518, 519, 520 and 522 are in non-conducting mode, and the N-gate signal is set to VDD.

During operation of the P-substrate signal circuitry 504, when the I/O_circuit_enable signal is de-asserted and the voltage at I/O pad 116 is between VDD and VSS, the Sn signal provided by under-voltage detector circuit 114 (FIG. 6) will be low and N-channel transistor 512 will be in non-conducting mode. The Sn_b_vdd and Sn_b_pad signals will be high placing respective N-channel transistors 514 and 516 in conductive mode. I/O_circuit_enable signal will be low placing N-channel transistors 506, 508 in non-conducting mode. The P-substrate signal output by P-substrate signal circuitry 504 will be VSS due to transistors 514 and 516 being in conducting mode. When the I/O_circuit_enable signal is de-asserted and the voltage at I/O pad 116 is less than VSS, the P-substrate signal equals the pad voltage. When the voltage at I/O pad 116 is greater than VDD, the P-substrate signal is VSS. When the I/O_circuit_enable signal is asserted, N-channel transistors 506 and 508 are in conducting mode, thereby setting P-substrate signal is set to VSS.

FIG. 6 illustrates a schematic diagram of an embodiment of a comparator for under-voltage detection circuit 114 that can be used in the integrated circuit 100 of FIG. 1 including voltage divider circuit 602, selection circuit 604, inverter circuit 603, and NOR logic circuits 605, 607. Voltage divider circuit 602 includes N-channel transistors 610, 612, 614, 616, 618, 620, 622, 624, 626 and 628 connected in series with a drain electrode of N-channel transistor 612 coupled to a source electrode of N-channel transistor 610, a drain electrode of N-channel transistor 614 coupled to a source electrode of N-channel transistor 616, and so on. A control electrode and a drain electrode of P-channel transistor 610 are coupled to supply voltage VDD. Control electrodes of N-channel transistors 612-628 are coupled to respective source electrodes of N-channel transistors 612-628. Body terminals of N-channel transistors 610-628 are coupled to respective source electrodes of N-channel transistors 610-628.

Note the output from voltage divider circuit 602 can be tapped between any pair of N-channel transistors 610-628 depending on the margin between the pad voltage and supply voltages VDD and VSS at which the comparison for under-voltage conditions are selected to begin. Additionally, voltage divider circuit 602 can include fewer or more transistors than N-channel transistors 610-628, depending on the level of current desired. P-channel transistors can alternatively be used instead of N-channel transistors 610-628.

Selection circuit 604 includes P-channel transistor 640 coupled in series with P-channel transistor 638, and N-channel transistor 634 coupled in series with transistor 638. An input voltage (gatev signal) provided to a control electrode of N-channel transistor 634 is an output of voltage divider circuit 602. N-channel transistor 634 further includes a drain electrode coupled to the pad voltage, a body terminal coupled to the P-substrate signal, and a source electrode coupled to a drain electrode of P-channel transistor 638. P-channel transistor 638 further includes a control electrode coupled to the source electrode of P-channel transistor 638, a body terminal coupled to supply voltage VDD, and a source electrode coupled to a drain electrode of P-channel transistor 640. P-channel transistor 640 further includes a control electrode coupled to the I/O_circuit_enable signal, a body terminal and a source electrode coupled to supply voltage VDD.

An output of selection circuit 604 is tapped at the drain electrode of P-channel transistor 638 and will be either the pad voltage or supply voltage VDD, depending on whether the pad voltage is greater than supply voltage VDD and the I/O_circuit_enable signal is high or low, as explained in more detail in the description for FIG. 2 herein.

N-channel transistor 606 includes a source electrode coupled to supply voltage VSS, a control electrode coupled to the I/O_circuit_enable signal, and a drain electrode coupled to the input of selection circuit 404 and an input to inverter circuit 603.

P-channel transistor 608 includes a source electrode coupled to supply voltage VDD, a control electrode coupled to the output of an inverter circuit 603 and a drain electrode coupled between the drain electrode of transistor 606 and the input of inverter circuit 603. An Sn_b_pad signal is tapped at the drain electrode of P-channel transistor 608.

Inverter circuit 603 includes P-channel transistor 642 and N-channel transistor 644. P-channel transistor 642 includes a source electrode and body terminal coupled to supply voltage VDD, a control electrode coupled to the output of selection circuit 604 (Sn_b_pad signal), and a drain electrode coupled to a source electrode of N-channel transistor 644. N-channel transistor 644 further includes a control electrode coupled to the output of selection circuit 604 (Sn_b_pad signal), a body terminal and a drain electrode coupled to supply voltage VSS.

An output voltage of inverter circuit 603 is provided as an input to NOR logic circuit 605 that includes P-channel transistors 650, 652 and N-channel transistors 654, 656. P-channel transistor 650 includes a source electrode and a body terminal coupled to supply voltage VDD, a drain electrode coupled to a source electrode of P-channel transistor 652 and a control electrode coupled to the I/O_circuit_enable signal. P-channel transistor 652 further includes a body terminal coupled to supply voltage VDD, a control electrode coupled to the output of inverter circuit 603, and a drain electrode coupled to drain electrodes of N-channel transistors 654 and 656. The drain electrodes of N-channel transistors 654 and 656 are also coupled to each other. Source electrodes of N-channel transistors 654 and 656 are coupled to supply voltage VSS and to each other. A control electrode of N-channel transistor 654 is coupled to the output of inverter circuit 603. A control electrode of N-channel transistor 656 is coupled to the I/O_circuit_enable signal. An output signal (Sn_b_vdd) of NOR logic circuit 605 is tapped at a node where the drain electrode of P-channel transistor 652 is coupled to the drain electrodes of N-channel transistors 654 and 656.

The Sn_b_vdd signal is provided as input to NOR logic circuit 607 that includes P-channel transistors 662, 664 and N-channel transistors 658, 660. P-channel transistor 662 includes a source electrode and a body terminal coupled to supply voltage VDD, a drain electrode coupled to a source electrode of P-channel transistor 664 and a control electrode coupled to the I/O_circuit_enable signal. P-channel transistor 664 further includes a body terminal coupled to supply voltage VDD, a control electrode coupled to the output of NOR logic circuit 605, and a drain electrode coupled to drain electrodes of N-channel transistors 658 and 660. The drain electrodes of N-channel transistors 658 and 660 are also coupled to each other. Source electrodes of N-channel transistors 658 and 660 are coupled to supply voltage VSS and to each other. A control electrode of N-channel transistor 658 is coupled to the output of NOR logic circuit 605. A control electrode of N-channel transistor 660 is coupled to the I/O_circuit_enable signal. An output signal (Sn) of NOR logic circuit 607 is tapped at a node where the drain electrode of P-channel transistor 664 is coupled to the drain electrodes of N-channel transistors 658 and 660. The Sn signal is provided as input to N-gate selection circuitry 114 (FIGS. 1 and 5).

During operation of under-voltage detection circuit 114, when the I/O_circuit_enable signal is de-asserted, P-channel transistors 640, 650 and 662 are conducting and N-channel transistors 606, 656, and 660 are not conducting. Once the output of voltage divider 602 (shown as a gatev signal) is greater than the threshold voltage of N-channel transistor 634, the Sn_b_pad signal is set high. Inverter circuit 603 provides an inverted SN_b_pad signal to NOR logic circuit 605. When both the input to the NOR logic circuit 605 from inverter circuit 603 and the I/O_circuit_enable signal are high, or one is high and the other is low, the output of NOR logic circuit 605 (shown as the Sn_b_vdd signal) will be low. Otherwise, if the input to the NOR logic circuit 605 from inverter circuit 603 and the I/O_circuit_enable signal are both low, the Sn_b_vdd signal is low.

For NOR logic circuit 607, when both the Sn_b_vdd signal from NOR logic circuit 605 and the I/O_circuit_enable signal are high, or one is high and the other is low, the output of NOR logic circuit 607 (shown as the Sn signal) will be low. Otherwise, if the Sn_b_vdd signal and the I/O_circuit_enable signal are both low, the Sn signal is high.

When the I/O_circuit_enable signal is asserted, P-channel transistors 640, 650 and 662 are not conducting and N-channel transistors 606, 656, and 660 are conducting. The Sn_b_pad, Sn_b_vdd and Sn signal will be low.

Figure 7:
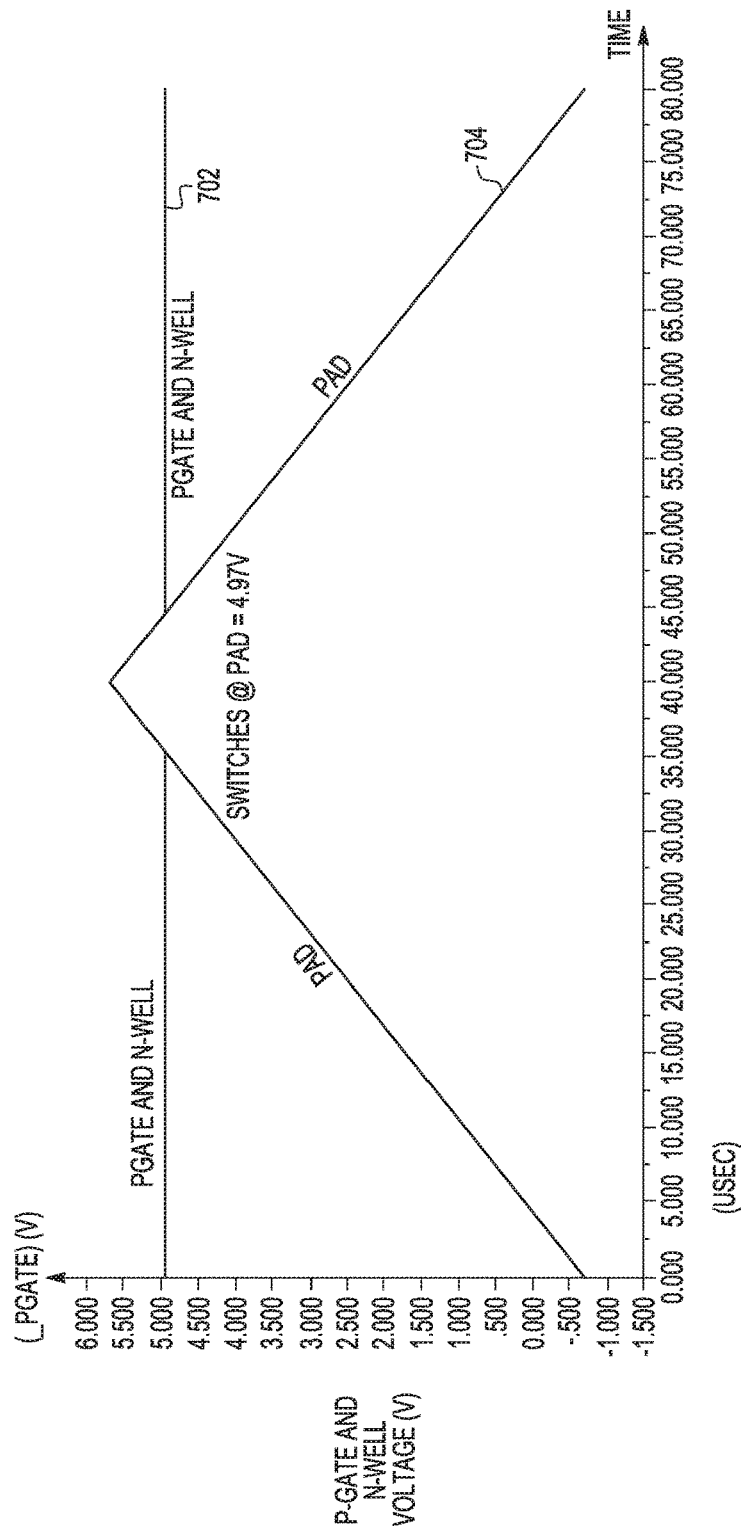
FIG. 7 shows a time history graph of an example of P-gate and N-well signals over a range of operating voltages in the integrated circuit of FIG. 1.

FIG. 7 shows a time history graph of an example of P-gate and N-well signals over a range of operating voltages in the integrated circuit 100 of FIG. 1. Line 702 indicates the P-gate and N-well signals when the voltage on pad 116 (FIG. 1) is swept from −0.7 to 5.7 Volts and back down to −0.7 Volts, which is indicated by line 704. As the voltage on pad 116 ranges between −0.7 and 4.97 Volts, the P-gate and N-well signals are steady at 5 Volts, which is close to the value of supply voltage VDD. Instead of continuing to apply supply voltage VDD to the control electrode (P-gate) and N-well of P-transistor 104, the integrated circuit 100 (FIG. 1) selects the voltage on pad 116 to apply to the control electrode (P-gate) and N-well of P-channel transistor 104 until the voltage on pad 116 is above 4.97 Volts. The voltage at which the maximum between the pad voltage and supply voltage VDD is applied to the P-gate and N-well of transistor 104 depends on process variation. Note the location at which the VDD_input signal is tapped on voltage divider 402 (FIG. 4) can be selected to compensate for variation in the threshold voltage value for P-channel transistor 104 between different integrated circuits 100. Leakage current will be reduced with the control electrode and N-well of P-channel transistor 104 tied to the pad voltage during an over-voltage condition where the voltage at pad 116 is greater than the value of supply voltage VDD.

Figure 8:
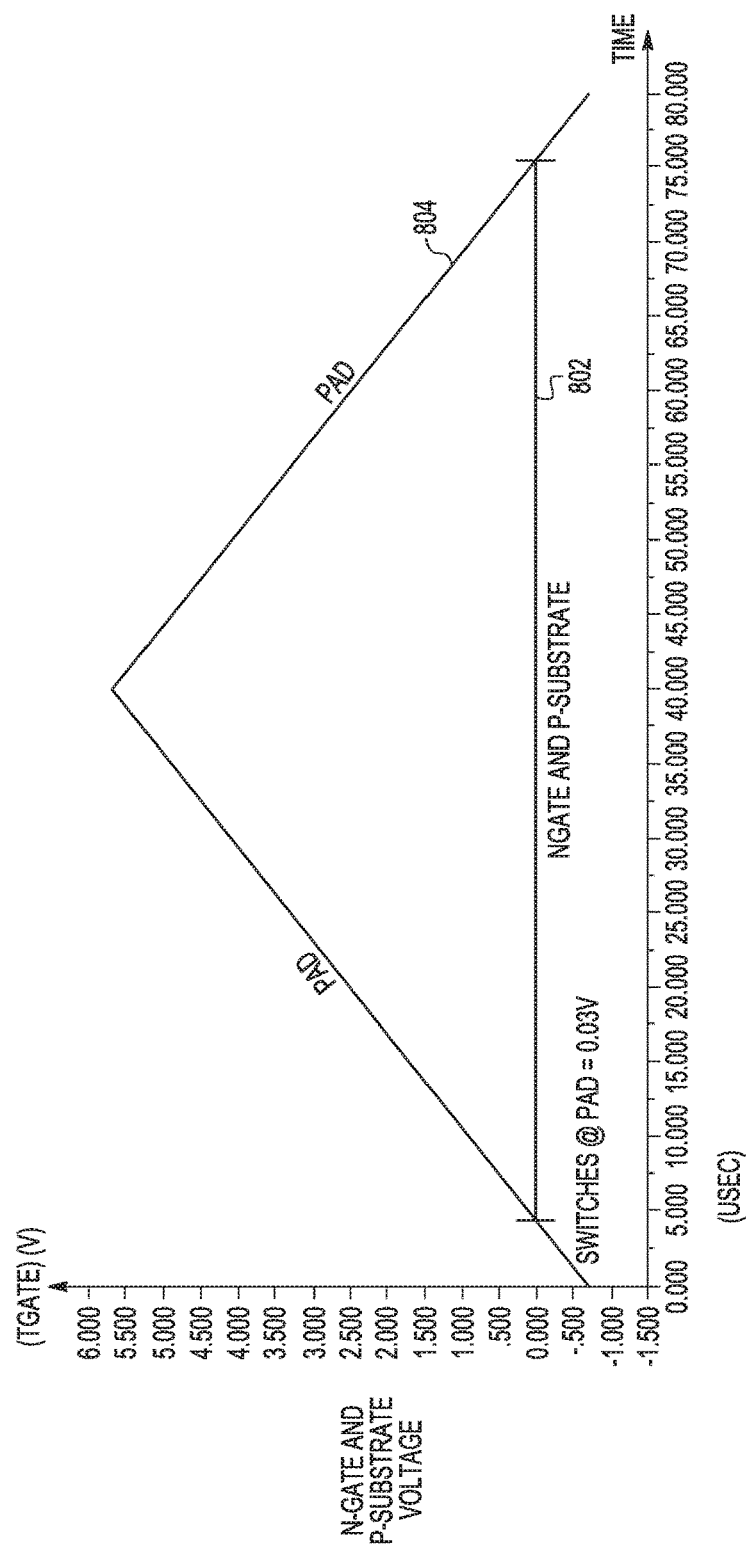
FIG. 8 shows a time history graph of an example of N-gate and P-substrate signals over a range of operating voltages in the integrated circuit of FIG. 1.

FIG. 8 shows a time history graph of an example of N-gate and P-substrate signals over a range of operating voltages in the integrated circuit 100 of FIG. 1. Line 802 indicates the P-substrate and N-gate signals when the voltage on pad 116 (FIG. 1) is swept from −0.7 to 5.7 Volts and back down to −0.7 Volts, which is indicated by line 804. As the voltage on pad 116 is in an under-voltage condition, ranging between −0.7 and 0.03 Volts, the N-gate and P-substrate signals on N-channel transistor 106 are set to voltage on pad 116. Once the value of the voltage on pad 116 is below 0.03 Volts, integrated circuit 100 (FIG. 1) selects the voltage on pad 116 to apply to the control electrode (N-gate) and substrate (P-substrate) of N-channel transistor. The voltage at which the minimum between the pad voltage and supply voltage VSS is applied to the P-substrate and N-gate of transistor 106 depends on process variation. Note the location at which the gatev signal is tapped on voltage divider 602 (FIG. 6) can be selected to compensate for variation in the threshold voltage value for N-channel transistor 106 between different integrated circuits 100. Leakage current will be reduced with the control electrode and substrate of N-channel transistor 106 tied to the pad voltage during an under-voltage condition where the voltage at pad 116 is less than the value of supply voltage VSS.

Figure 9:
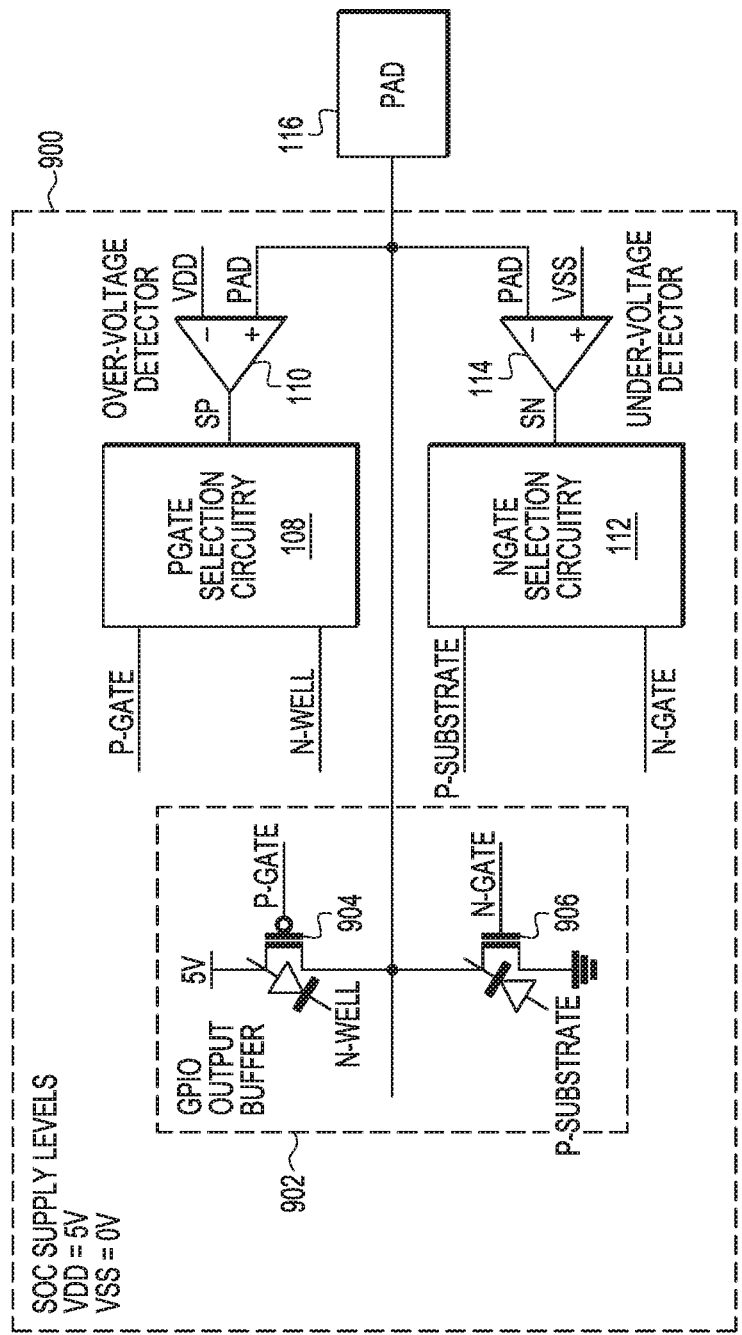
FIG. 9 illustrates a block diagram of an integrated circuit with over and under-voltage detection in accordance with selected embodiments of the invention.

FIG. 9 illustrates a block diagram of an integrated circuit 900 with over and under voltage detection in accordance with other selected embodiments of the invention. In the example shown, IC 900 includes input/output (I/O) circuitry (also referred to as an output buffer) 902 with P-channel transistor 904 and N-channel transistor 906, P-gate selection circuitry 108, over voltage detection circuit 110, N-gate selection circuitry 112, negative voltage detector 114, and I/O pad 116. I/O pad 116 is coupled to a non-negating input of over voltage detector 110, a negating input of negative voltage detector 114, and drain electrodes of P-channel transistor 904 and N-channel transistor 906. Drain electrodes of P-channel transistor 904 and N-channel transistor 906 are also coupled to one another. A source electrode of P-channel transistor 904 is coupled to supply voltage VDD and a source electrode of N-channel transistor 906 is coupled to a different supply voltage VSS. The structure and operation of P-gate selection circuitry 108, over voltage detection circuit 110, N-gate selection circuitry 112, negative voltage detector 114, and I/O pad 116 is the same as that described herein for FIGS. 3-6. I/O circuitry 902 is configured as general-purpose I/O circuitry. When there is an over-voltage condition, leakage current flows from pad 116 to supply voltage VDD. When there is an under-voltage condition, leakage current flows from supply voltage VSS to pad 116. The leakage current can be reduced and even eliminated by using P-gate selection circuitry 108 and over voltage detection circuit 110 to set the P-gate and N-well signals to the pad voltage during the over-voltage condition, and using N-gate selection circuitry 112 and negative voltage detector 114 to set the N-gate and P-substrate to the pad voltage during the under-voltage condition.

By now it should be appreciated that in some embodiments there has been provided an integrated circuit that can comprise a pad (116 or pad of FIG. 1) configured to receive a pad voltage and input/output (I/O) circuitry (102, or output buffer of FIG. 1) coupled to the pad and having a first P-type Metal-Oxide-Semiconductor (PMOS) device and a first N-type Metal-Oxide-Semiconductor (NMOS) device. A first current electrode of the first PMOS device can be connected to a first current electrode of the first NMOS and to the pad. A first voltage supply node (VDD) can be configured to receive a first supply voltage. A second voltage supply node (VSS) can be configured to receive a second supply voltage different from the first supply voltage. First selection circuitry can be configured to, when the I/O circuitry is disabled, provide the first supply voltage to a control electrode of the first PMOS device and an N-well of the first PMOS device when the pad voltage is lower than the first supply voltage and to directly provide the pad voltage to the control electrode of the first PMOS device and the N-well of the first PMOS device when the pad voltage is greater than the first supply voltage. Second selection circuitry can be configured to, when the I/O circuitry is disabled, provide the second supply voltage to a control electrode of the first NMOS device and a P-well of the first NMOS device when the pad voltage is higher than the second supply voltage and to directly provide the pad voltage to the control electrode of the first NMOS device and the P-well of the first NMOS device when the pad voltage is less than the second supply voltage.

In another aspect, the first selection circuitry can be configured to, when the I/O buffer is enabled, provide the second voltage supply to the control electrode of the first PMOS device and the first voltage supply to the N-well of the first PMOS device. The second selection circuitry can be configured to, when the I/O buffer is enabled, provide the first voltage supply to the control electrode of the first NMOS device and the second voltage supply to the P-well of the first NMOS device.

In another aspect, the integrated circuit can further comprise first comparison circuitry (110) coupled to the first voltage supply node and the pad and having a first output configured to, when the I/O circuitry is disabled, provide a first comparison result (Sp) between the pad voltage and the first supply voltage to the first selection circuitry. Second comparison circuitry (114) can be coupled to the second voltage supply node and the pad and a first output configured to, when the I/O circuitry is disabled, provide a second comparison result (Sn) between the pad voltage and the second supply voltage to the second selection circuitry.

In another aspect, the first selection circuitry can comprise a second PMOS device (312) having a first current electrode coupled to the pad, a control electrode coupled to the first output of the first comparison circuitry, and a second current electrode coupled to the N-well of the first PMOS device. A third PMOS device (314) can have a first current electrode coupled to the first voltage supply node, a control electrode coupled to a second output of the first comparison circuitry (Sp_b_vdde), and a second current electrode. A fourth PMOS device (316) can have a first current electrode coupled to the second current electrode of the third PMOS device, a control electrode coupled to a third output of the first comparison circuitry (Sp_b_pad), and a second current electrode coupled to the N-well of the first PMOS device.

In another aspect, the first output of the first comparison circuitry can provide the first comparison result in a voltage domain of the first supply voltage. The second output of the first comparison circuitry can be configured to provide an inverse logic value of the first comparison result in the voltage domain of the first supply voltage, and the third output of the first comparison circuitry can be configured to provide an inverse logic value of the first comparison result in a voltage domain of the pad voltage.

In another aspect, the integrated circuit can further comprise voltage translation circuitry coupled between the third and second outputs of the first comparison circuit to translate from the voltage domain of the pad voltage to the voltage domain of the first supply voltage.

In another aspect, the first selection circuitry can further comprise a fifth PMOS device (318) having a first current electrode coupled to the pad, a control electrode coupled the first output of the first comparison circuitry, and a second current electrode coupled to the control electrode of the first PMOS device. A sixth PMOS device (320) can have a first current electrode coupled to the first voltage supply node, a control electrode coupled to the second output of the first comparison circuitry (Sp_b_vdde), and a second current electrode. A seventh PMOS device (322) can have a first current electrode coupled to the second current electrode of the sixth PMOS device, a control electrode coupled to the third output of the first comparison circuitry (Sp_b_pad), and a second current electrode coupled to the control electrode of the first PMOS device.

In another aspect, the first selection circuitry can further comprise an eighth PMOS device (306) having a first current electrode coupled to the first voltage supply node, a control electrode coupled to receive an inverse pad enable signal, and a second current electrode, wherein the inverse pad enable signal is an inverse of a pad enable signal in the voltage domain of the first supply voltage. A ninth PMOS device (308) can have a first current electrode coupled to the second current electrode of the eighth PMOS device, a control electrode coupled to receive a second inverse pad enable signal, and a second current electrode coupled to the N-well of the first PMOS device, wherein the second inverse pad enable signal is an inverse of the pad enable signal in the voltage domain of the pad voltage. A second NMOS device (310) can have a first current electrode coupled to the second voltage supply node, a control electrode coupled to receive the pad enable signal, and a second current electrode coupled to the control electrode of the first PMOS device.

In another aspect, the second selection circuitry can further comprise a second NMOS device (518) having a first current electrode coupled to the pad, a control electrode coupled to the first output of the second comparison circuitry, and a second current electrode. A third NMOS device (519) can have a first current electrode coupled to the second current electrode of the second NMOS device, a control electrode coupled to the first output of the second comparison circuitry, a second current electrode coupled to the control electrode of the first NMOS device, and a body electrode coupled to the P-well of the first NMOS device. A fourth NMOS device (520) can have a first current electrode coupled to the second voltage supply node, a control electrode coupled to a second output of the second comparison circuitry (Sn_b_vdde), and a second current electrode. A fifth NMOS device (522) can have a first current electrode coupled to a second current electrode of the fourth NMOS device, a control electrode coupled to a third output of the second comparison circuitry (Sn_b_pad), and a body electrode coupled to the P-well of the first NMOS device.

In another aspect, the first output of the second comparison circuitry can provide the second comparison result in a voltage domain of the first supply voltage, the second output of the second comparison circuitry can be configured to provide an inverse logic value of the second comparison result in a voltage domain of the first supply voltage, and the third output of the second comparison circuitry can be configured to provide an inverse logic value of the second comparison result in a voltage domain of the pad voltage.

In another aspect, the integrated circuit can further comprise voltage translation circuitry coupled between the third and second outputs of the second comparison circuit to translate from the voltage domain of the pad voltage to the voltage domain of the first supply voltage.

In another aspect, the second selection circuitry can further comprise a sixth NMOS device (512) having a first current electrode coupled to the pad, a control electrode coupled to the first output of the second comparison circuitry, and a second current electrode. A seventh NMOS device (514) can have a first current electrode coupled to the second voltage supply node, a control electrode coupled to the second output of the second comparison circuitry, and a second current electrode. An eighth NMOS device (516) can have a first current electrode coupled to the second current electrode of the seventh NMOS device, a control electrode coupled to the third output of the second comparison circuitry, and a second current electrode coupled to the P-well of the first NMOS device.

In another aspect, the second selection circuitry can further comprise a second PMOS device (510) having a first current electrode coupled to the first voltage supply node, a control electrode coupled to receive an inverse pad enable signal, and a second current electrode coupled to the control electrode of the first NMOS device, wherein the inverse pad enable signal is an inverse of a pad enable signal in the voltage domain of the first supply voltage. A ninth NMOS device (506) can have a first current electrode coupled to the second voltage supply node, a control electrode coupled to receive the pad enable signal, and a second current electrode. A tenth NMOS device (508) can have a first current electrode coupled to the second current electrode of the ninth NMOS device, a control electrode coupled to receive a second inverse pad enable signal, and a second current electrode coupled to the P-well of the first NMOS device, wherein the second inverse pad enable signal is an inverse of the pad enable signal in the voltage domain of the pad voltage.

In another aspect, the I/O circuitry can comprise a transmission gate including the first PMOS device and the first NMOS device, wherein a second current electrode of the first PMOS device is connected to a second current electrode of the first NMOS device and core circuitry of the integrated circuit, wherein the core circuitry is powered by the first and second voltage supply nodes.

In another aspect, the I/O circuitry can comprise an output buffer including the first PMOS device and the first NMOS device, wherein a second current electrode of the first PMOS device is coupled to the first voltage supply node and a second current electrode of the first NMOS device is coupled to the second voltage supply node.

In another aspect, the first comparison circuitry can comprise a first voltage divider having a second PMOS device (420) having a first current electrode coupled to the first voltage supply node, a second current electrode, and a control electrode coupled to the second current electrode of the second PMOS device. A plurality of PMOS devices (422-430) can be coupled in series between the second current electrode of the second PMOS device and the second voltage supply node, wherein the first voltage divider is configured to provide a divided voltage based on the first supply voltage at the second current electrode of the second PMOS device when the I/O circuitry is disabled. A third PMOS device (434) can have a first current electrode coupled to the pad, a control electrode coupled to the second current electrode of the second PMOS device, and a second current electrode configured to provide the third output of the first comparison circuitry when the I/O circuitry is disabled.

In another aspect, the second comparison circuitry can comprise a second voltage divider having a second NMOS device (626) having a first current electrode, a second current electrode coupled to the second voltage supply node, and a control electrode coupled to the second current electrode of the second NMOS device. A plurality of NMOS devices (612-624) can be coupled in series between the first voltage supply node and the first current electrode of the second NMOS device, wherein the voltage divider is configured to provide a divided voltage based on the first supply voltage at the first current electrode of the second NMOS device. A third NMOS device (634) can have a first current electrode configured to provide the third output of the second comparison circuitry when the I/O circuitry is disabled, a control electrode coupled to the first current electrode of the second NMOS device, and a second current electrode coupled to the pad.

In another embodiment, an integrated circuit can comprise a pad (116 or pad of FIG. 11) configured to receive a pad voltage, and input/output circuitry (102, or output buffer of FIG. 11) coupled to the pad and having a first P-type Metal-Oxide-Semiconductor (PMOS) device and a first N-type Metal-Oxide-Semiconductor (NMOS) device. A first current electrode of the first PMOS device is connected to a first current electrode of the first NMOS and to the pad. A first voltage supply node (VDD) can be configured to receive a first supply voltage. A second voltage supply node (VSS) can be configured to receive a second supply voltage different from the first supply voltage. First selection circuitry can be coupled to the first voltage supply node, the second voltage supply node, and the pad. Second selection circuitry can be coupled to the first voltage supply node, the second voltage supply node, and the pad. First comparison circuitry (110) can be coupled to the first voltage supply node and the pad and having a first output configured to, when the I/O circuitry is disabled, provide a first comparison result (Sp as qualified by OEb) between the pad voltage and the first supply voltage to the first selection circuitry. Second comparison circuitry (114) coupled to the second voltage supply node and the pad and a first output can be configured to, when the I/O circuitry is disabled, provide a second comparison result (Sn as qualified by OEb) between the pad voltage and the second supply voltage to the second selection circuitry. The first selection circuitry can include a second PMOS device (312) having a first current electrode coupled to the pad, a control electrode coupled to the first output of the first comparison circuitry, and a second current electrode coupled to the N-well of the first PMOS device. A third PMOS device (314) can have a first current electrode coupled to the first voltage supply node, a control electrode coupled to a second output of the first comparison circuitry (Sp_b_vdde), and a second current electrode. A fourth PMOS device (316) can have a first current electrode coupled to the second current electrode of the third PMOS device, a control electrode coupled to a third output of the first comparison circuitry (Sp_b_pad), and a second current electrode coupled to the N-well of the first PMOS device. The second selection circuitry can include a second NMOS device (518) having a first current electrode coupled to the pad, a control electrode coupled to the first output of the second comparison circuitry, and a second current electrode. A third NMOS device (519) can have a first current electrode coupled to the second current electrode of the second NMOS device, a control electrode coupled to the first output of the second comparison circuitry, a second current electrode coupled to the control electrode of the first NMOS device, and a body electrode coupled to the P-well of the first NMOS device. A fourth NMOS device (520) can have a first current electrode coupled to the second voltage supply node, a control electrode coupled to a second output of the second comparison circuitry (Sn_b_vdde), and a second current electrode. A fifth NMOS device (522) can have a first current electrode coupled to a second current electrode of the fourth NMOS device, a control electrode coupled to a third output of the second comparison circuitry (Sn_b_pad), and a body electrode coupled to the P-well of the first NMOS device.

In another aspect, the first selection circuitry can further comprise a fifth PMOS device (318) having a first current electrode coupled to the pad, a control electrode coupled the first output of the first comparison circuitry, and a second current electrode coupled to the control electrode of the first PMOS device. A sixth PMOS device (320) can have a first current electrode coupled to the first voltage supply node, a control electrode coupled to the second output of the first comparison circuitry (Sp_b_vdde), and a second current electrode. A seventh PMOS device (322) can have a first current electrode coupled to the second current electrode of the sixth PMOS device, a control electrode coupled to the third output of the first comparison circuitry (Sp_b_pad), and a second current electrode coupled to the control electrode of the first PMOS device. An eighth PMOS device (306) can have a first current electrode coupled to the first voltage supply node, a control electrode coupled to receive an inverse pad enable signal, and a second current electrode, wherein the inverse pad enable signal is an inverse of a pad enable signal in the voltage domain of the first supply voltage. A ninth PMOS device (308) can have a first current electrode coupled to the second current electrode of the eighth PMOS device, a control electrode coupled to receive a second inverse pad enable signal, and a second current electrode coupled to the N-well of the first PMOS device, wherein the second inverse pad enable signal is an inverse of the pad enable signal in the voltage domain of the pad voltage. A sixth NMOS device (310) can have a first current electrode coupled to the second voltage supply node, a control electrode coupled to receive the pad enable signal, and a second current electrode coupled to the control electrode of the first PMOS device. The second selection circuitry can further comprise a seventh NMOS device (512) having a first current electrode coupled to the pad, a control electrode coupled to the first output of the second comparison circuitry, and a second current electrode. An eighth NMOS device (514) can have a first current electrode coupled to the second voltage supply node, a control electrode coupled to the second output of the second comparison circuitry, and a second current electrode. An ninth NMOS device (516) can have a first current electrode coupled to the second current electrode of the eighth NMOS device, a control electrode coupled to the third output of the second comparison circuitry, and a second current electrode coupled to the P-well of the first NMOS device. A tenth PMOS device (510) can have a first current electrode coupled to the first voltage supply node, a control electrode coupled to receive an inverse pad enable signal, and a second current electrode coupled to the control electrode of the first NMOS device, wherein the inverse pad enable signal is an inverse of a pad enable signal in the voltage domain of the first supply voltage. A tenth NMOS device (506) can have a first current electrode coupled to the second voltage supply node, a control electrode coupled to receive the pad enable signal, and a second current electrode. An eleventh NMOS device (508) can have a first current electrode coupled to the second current electrode of the tenth NMOS device, a control electrode coupled to receive a second inverse pad enable signal, and a second current electrode coupled to the P-well of the first NMOS device, wherein the second inverse pad enable signal is an inverse of the pad enable signal in the voltage domain of the pad voltage.

In still another embodiment, an integrated circuit can comprise a pad (116 or pad of FIG. 1) configured to receive a pad voltage, and input/output circuitry (102, or output buffer of FIG. 1) coupled to the pad and having a first P-type Metal-Oxide-Semiconductor (PMOS) device and a first N-type Metal-Oxide-Semiconductor (NMOS) device. A first current electrode of the first PMOS device can be connected to a first current electrode of the first NMOS and to the pad. A first voltage supply node (VDD) can be configured to receive a first supply voltage. A second voltage supply node (VSS) can be configured to receive a second supply voltage different from the first supply voltage. First selection circuitry can be configured to, when the I/O buffer is disabled, provide the first supply voltage to a control electrode of the first PMOS device and an N-well of the first PMOS device when the pad voltage is between the first and second supply voltage and to directly provide the pad voltage to the control electrode of the first PMOS device and the N-well of the first PMOS device when the pad voltage is greater than the first supply voltage. Second selection circuitry configured to provide the second supply voltage to a control electrode of the first NMOS device and a P-well of the first NMOS device when the pad voltage is between the first and second supply voltage and to directly provide the pad voltage to the control electrode of the first NMOS device and the P-well of the first NMOS device when the pad voltage is less than the second supply voltage. First comparison circuitry can comprise a first voltage divider having a second PMOS device (420) with a first current electrode coupled to the first voltage supply node, a second current electrode, and a control electrode coupled to the second current electrode of the second PMOS device. A plurality of PMOS devices (422-430) can be coupled in series between the second current electrode of the second PMOS device and the second voltage supply node, wherein the first voltage divider is configured to provide a divided voltage based on the first supply voltage at the second current electrode of the second PMOS device when the I/O circuitry is disabled. A third PMOS device (434) can have a first current electrode coupled to the pad, a control electrode coupled to the second current electrode of the second PMOS device, and a second current electrode configured to provide the third output of the first comparison circuitry when the I/O circuitry is disabled. Second comparison circuitry can comprise a second voltage divider having a second NMOS device (626) having a first current electrode, a second current electrode coupled to the second voltage supply node, and a control electrode coupled to the second current electrode of the second NMOS device. A plurality of NMOS devices (612-624) can be coupled in series between the first voltage supply node and the first current electrode of the second NMOS device, wherein the voltage divider is configured to provide a divided voltage based on the first supply voltage at the first current electrode of the second NMOS device. A third NMOS device (634) can have a first current electrode configured to provide the third output of the second comparison circuitry when the I/O circuitry is disabled, a control electrode coupled to the first current electrode of the second NMOS device, and a second current electrode coupled to the pad.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit, comprising:
   a pad configured to receive a pad voltage;
   input/output (I/O) circuitry coupled to the pad and having a first P-type Metal-Oxide-Semiconductor (PMOS) device and a first N-type Metal-Oxide-Semiconductor (NMOS) device, wherein a first current electrode of the first PMOS device is connected to a first current electrode of the first NMOS and to the pad;
   a first voltage supply node configured to receive a first supply voltage;
   a second voltage supply node configured to receive a second supply voltage different from the first supply voltage;
   first selection circuitry configured to, when the I/O circuitry is disabled, provide the first supply voltage to a control electrode of the first PMOS device and an N-well of the first PMOS device when the pad voltage is lower than the first supply voltage and to directly provide the pad voltage to the control electrode of the first PMOS device and the N-well of the first PMOS device when the pad voltage is greater than the first supply voltage; and
   second selection circuitry configured to, when the I/O circuitry is disabled, provide the second supply voltage to a control electrode of the first NMOS device and a P-well of the first NMOS device when the pad voltage is higher than the second supply voltage and to directly provide the pad voltage to the control electrode of the first NMOS device and the P-well of the first NMOS device when the pad voltage is less than the second supply voltage.

2. The integrated circuit of claim 1, wherein:
   the first selection circuitry is configured to, when the I/O buffer is enabled, provide the second voltage supply to the control electrode of the first PMOS device and the first voltage supply to the N-well of the first PMOS device, and
   the second selection circuitry is configured to, when the I/O buffer is enabled, provide the first voltage supply to the control electrode of the first NMOS device and the second voltage supply to the P-well of the first NMOS device.

3. The integrated circuit of claim 1, further comprising:
   first comparison circuitry coupled to the first voltage supply node and the pad and having a first output configured to, when the I/O circuitry is disabled, provide a first comparison result between the pad voltage and the first supply voltage to the first selection circuitry; and
   second comparison circuitry coupled to the second voltage supply node and the pad and a first output configured to, when the I/O circuitry is disabled, provide a second comparison result between the pad voltage and the second supply voltage to the second selection circuitry.

4. The integrated circuit of claim 3, wherein the first selection circuitry comprises:
   a second PMOS device having a first current electrode coupled to the pad, a control electrode coupled to the first output of the first comparison circuitry, and a second current electrode coupled to the N-well of the first PMOS device;
   a third PMOS device having a first current electrode coupled to the first voltage supply node, a control electrode coupled to a second output of the first comparison circuitry, and a second current electrode; and
   a fourth PMOS device having a first current electrode coupled to the second current electrode of the third PMOS device, a control electrode coupled to a third output of the first comparison circuitry, and a second current electrode coupled to the N-well of the first PMOS device.

5. The integrated circuit of claim 4, wherein the first output of the first comparison circuitry provides the first comparison result in a voltage domain of the first supply voltage, the second output of the first comparison circuitry is configured to provide an inverse logic value of the first comparison result in the voltage domain of the first supply voltage, and the third output of the first comparison circuitry is configured to provide an inverse logic value of the first comparison result in a voltage domain of the pad voltage.

6. The integrated circuit of claim 5, further comprising voltage translation circuitry coupled between the third and second outputs of the first comparison circuit to translate from the voltage domain of the pad voltage to the voltage domain of the first supply voltage.

7. The integrated circuit of claim 5, wherein the first selection circuitry further comprises:
   a fifth PMOS device having a first current electrode coupled to the pad, a control electrode coupled the first output of the first comparison circuitry, and a second current electrode coupled to the control electrode of the first PMOS device;
   a sixth PMOS device having a first current electrode coupled to the first voltage supply node, a control electrode coupled to the second output of the first comparison circuitry, and a second current electrode; and
   a seventh PMOS device having a first current electrode coupled to the second current electrode of the sixth PMOS device, a control electrode coupled to the third output of the first comparison circuitry, and a second current electrode coupled to the control electrode of the first PMOS device.

8. The integrated circuit of claim 7, wherein the first selection circuitry further comprises:

an eighth PMOS device having a first current electrode coupled to the first voltage supply node, a control electrode coupled to receive an inverse I/O_circuit_enable signal, and a second current electrode, wherein the inverse I/O_circuit_enable signal is an inverse of a I/O_circuit_enable signal in the voltage domain of the first supply voltage;

a ninth PMOS device having a first current electrode coupled to the second current electrode of the eighth PMOS device, a control electrode coupled to receive a second inverse I/O_circuit_enable signal, and a second current electrode coupled to the N-well of the first PMOS device, wherein the second inverse I/O_circuit_enable signal is an inverse of the I/O_circuit_enable signal in the voltage domain of the pad voltage; and a second NMOS device having a first current electrode coupled to the second voltage supply node, a control electrode coupled to receive the I/O_circuit_enable signal, and a second current electrode coupled to the control electrode of the first PMOS device.

9. The integrated circuit of claim 1, wherein the second selection circuitry further comprises:
a second NMOS device having a first current electrode coupled to the pad, a control electrode coupled to the first output of the second comparison circuitry, and a second current electrode;
a third NMOS device having a first current electrode coupled to the second current electrode of the second NMOS device, a control electrode coupled to the first output of the second comparison circuitry, a second current electrode coupled to the control electrode of the first NMOS device, and a body electrode coupled to the P-well of the first NMOS device;
a fourth NMOS device having a first current electrode coupled to the second voltage supply node, a control electrode coupled to a second output of the second comparison circuitry, and a second current electrode; and
a fifth NMOS device having a first current electrode coupled to a second current electrode of the fourth NMOS device, a control electrode coupled to a third output of the second comparison circuitry, and a body electrode coupled to the P-well of the first NMOS device.

10. The integrated circuit of claim 9, wherein the first output of the second comparison circuitry provides the second comparison result in a voltage domain of the first supply voltage, the second output of the second comparison circuitry is configured to provide an inverse logic value of the second comparison result in a voltage domain of the first supply voltage, and the third output of the second comparison circuitry is configured to provide an inverse logic value of the second comparison result in a voltage domain of the pad voltage.

11. The integrated circuit of claim 10, further comprising voltage translation circuitry coupled between the third and second outputs of the second comparison circuit to translate from the voltage domain of the pad voltage to the voltage domain of the first supply voltage.

12. The integrated circuit of claim 10, wherein the second selection circuitry further comprises:
a sixth NMOS device having a first current electrode coupled to the pad, a control electrode coupled to the first output of the second comparison circuitry, and a second current electrode;

a seventh NMOS device having a first current electrode coupled to the second voltage supply node, a control electrode coupled to the second output of the second comparison circuitry, and a second current electrode;
an eighth NMOS device having a first current electrode coupled to the second current electrode of the seventh NMOS device, a control electrode coupled to the third output of the second comparison circuitry, and a second current electrode coupled to the P-well of the first NMOS device.

13. The integrated circuit of claim 12, wherein the second selection circuitry further comprises:
a second PMOS device having a first current electrode coupled to the first voltage supply node, a control electrode coupled to receive an inverse I/O_circuit_enable signal, and a second current electrode coupled to the control electrode of the first NMOS device, wherein the inverse I/O_circuit_enable signal is an inverse of a I/O_circuit_enable signal in the voltage domain of the first supply voltage;
a ninth NMOS device having a first current electrode coupled to the second voltage supply node, a control electrode coupled to receive the I/O_circuit_enable signal, and a second current electrode;
a tenth NMOS device having a first current electrode coupled to the second current electrode of the ninth NMOS device, a control electrode coupled to receive a second inverse I/O_circuit_enable signal, and a second current electrode coupled to the P-well of the first NMOS device, wherein the second inverse I/O_circuit_enable signal is an inverse of the I/O_circuit_enable signal in the voltage domain of the pad voltage.

14. The integrated circuit of claim 1, wherein the I/O circuitry comprises a transmission gate including the first PMOS device and the first NMOS device, wherein a second current electrode of the first PMOS device is connected to a second current electrode of the first NMOS device and core circuitry of the integrated circuit, wherein the core circuitry is powered by the first and second voltage supply nodes.

15. The integrated circuit of claim 1, wherein the I/O circuitry comprises an output buffer including the first PMOS device and the first NMOS device, wherein a second current electrode of the first PMOS device is coupled to the first voltage supply node and a second current electrode of the first NMOS device is coupled to the second voltage supply node.

16. The integrated circuit of claim 3, wherein the first comparison circuitry comprises:
a first voltage divider having:
a second PMOS device having a first current electrode coupled to the first voltage supply node, a second current electrode, and a control electrode coupled to the second current electrode of the second PMOS device, and
a plurality of PMOS devices coupled in series between the second current electrode of the second PMOS device and the second voltage supply node, wherein the first voltage divider is configured to provide a divided voltage based on the first supply voltage at the second current electrode of the second PMOS device when the I/O circuitry is disabled; and
a third PMOS device have a first current electrode coupled to the pad, a control electrode coupled to the second current electrode of the second PMOS device, and a second current electrode configured to provide the third output of the first comparison circuitry when the I/O circuitry is disabled.

17. The integrated circuit of claim 16, wherein the second comparison circuitry comprises:
   a second voltage divider having:
      a second NMOS device having a first current electrode, a second current electrode coupled to the second voltage supply node, and a control electrode coupled to the second current electrode of the second NMOS device, and
      a plurality of NMOS devices coupled in series between the first voltage supply node and the first current electrode of the second NMOS device, wherein the voltage divider is configured to provide a divided voltage based on the first supply voltage at the first current electrode of the second NMOS device; and
   a third NMOS device have a first current electrode configured to provide the third output of the second comparison circuitry when the I/O circuitry is disabled, a control electrode coupled to the first current electrode of the second NMOS device, and a second current electrode coupled to the pad.

18. An integrated circuit, comprising:
   a pad configured to receive a pad voltage;
   input/output circuitry coupled to the pad and having a first P-type Metal-Oxide-Semiconductor (PMOS) device and a first N-type Metal-Oxide-Semiconductor (NMOS) device, wherein a first current electrode of the first PMOS device is connected to a first current electrode of the first NMOS and to the pad;
   a first voltage supply node configured to receive a first supply voltage;
   a second voltage supply node configured to receive a second supply voltage different from the first supply voltage;
   first selection circuitry coupled to the first voltage supply node, the second voltage supply node, and the pad;
   second selection circuitry coupled to the first voltage supply node, the second voltage supply node, and the pad;
   first comparison circuitry coupled to the first voltage supply node and the pad and having a first output configured to, when the I/O circuitry is disabled, provide a first comparison result between the pad voltage and the first supply voltage to the first selection circuitry; and
   second comparison circuitry coupled to the second voltage supply node and the pad and a first output configured to, when the I/O circuitry is disabled, provide a second comparison result between the pad voltage and the second supply voltage to the second selection circuitry,
   wherein the first selection circuitry includes:
      a second PMOS device having a first current electrode coupled to the pad, a control electrode coupled to the first output of the first comparison circuitry, and a second current electrode coupled to the N-well of the first PMOS device;
      a third PMOS device having a first current electrode coupled to the first voltage supply node, a control electrode coupled to a second output of the first comparison circuitry, and a second current electrode; and
      a fourth PMOS device having a first current electrode coupled to the second current electrode of the third PMOS device, a control electrode coupled to a third output of the first comparison circuitry, and a second current electrode coupled to the N-well of the first PMOS device, and
   wherein the second selection circuitry includes:
      a second NMOS device having a first current electrode coupled to the pad, a control electrode coupled to the first output of the second comparison circuitry, and a second current electrode;
      a third NMOS device having a first current electrode coupled to the second current electrode of the second NMOS device, a control electrode coupled to the first output of the second comparison circuitry, a second current electrode coupled to the control electrode of the first NMOS device, and a body electrode coupled to the P-well of the first NMOS device;
      a fourth NMOS device having a first current electrode coupled to the second voltage supply node, a control electrode coupled to a second output of the second comparison circuitry, and a second current electrode; and
      a fifth NMOS device having a first current electrode coupled to a second current electrode of the fourth NMOS device, a control electrode coupled to a third output of the second comparison circuitry, and a body electrode coupled to the P-well of the first NMOS device.

19. The integrated circuit of claim 18, wherein the first selection circuitry further comprises:
   a fifth PMOS device having a first current electrode coupled to the pad, a control electrode coupled the first output of the first comparison circuitry, and a second current electrode coupled to the control electrode of the first PMOS device;
   a sixth PMOS device having a first current electrode coupled to the first voltage supply node, a control electrode coupled to the second output of the first comparison circuitry, and a second current electrode; and
   a seventh PMOS device having a first current electrode coupled to the second current electrode of the sixth PMOS device, a control electrode coupled to the third output of the first comparison circuitry, and a second current electrode coupled to the control electrode of the first PMOS device; and
   an eighth PMOS device having a first current electrode coupled to the first voltage supply node, a control electrode coupled to receive an inverse I/O_circuit_enable signal, and a second current electrode, wherein the inverse I/O_circuit_enable signal is an inverse of a I/O_circuit_enable signal in the voltage domain of the first supply voltage;
   a ninth PMOS device having a first current electrode coupled to the second current electrode of the eighth PMOS device, a control electrode coupled to receive a second inverse I/O_circuit_enable signal, and a second current electrode coupled to the N-well of the first PMOS device, wherein the second inverse I/O_circuit_enable signal is an inverse of the I/O_circuit_enable signal in the voltage domain of the pad voltage; and
   a sixth NMOS device having a first current electrode coupled to the second voltage supply node, a control electrode coupled to receive the I/O_circuit_enable signal, and a second current electrode coupled to the control electrode of the first PMOS device; and
wherein the second selection circuitry further comprises:

a seventh NMOS device having a first current electrode coupled to the pad, a control electrode coupled to the first output of the second comparison circuitry, and a second current electrode;
an eighth NMOS device having a first current electrode coupled to the second voltage supply node, a control electrode coupled to the second output of the second comparison circuitry, and a second current electrode;
an ninth NMOS device having a first current electrode coupled to the second current electrode of the eighth NMOS device, a control electrode coupled to the third output of the second comparison circuitry, and a second current electrode coupled to the P-well of the first NMOS device;
a tenth PMOS device having a first current electrode coupled to the first voltage supply node, a control electrode coupled to receive an inverse I/O_circuit_enable signal, and a second current electrode coupled to the control electrode of the first NMOS device, wherein the inverse I/O_circuit_enable signal is an inverse of a I/O_circuit_enable signal in the voltage domain of the first supply voltage;
a tenth NMOS device having a first current electrode coupled to the second voltage supply node, a control electrode coupled to receive the I/O_circuit_enable signal, and a second current electrode;
a eleventh NMOS device having a first current electrode coupled to the second current electrode of the tenth NMOS device, a control electrode coupled to receive a second inverse I/O_circuit_enable signal, and a second current electrode coupled to the P-well of the first NMOS device, wherein the second inverse I/O_circuit_enable signal is an inverse of the I/O_circuit_enable signal in the voltage domain of the pad voltage.

20. An integrated circuit, comprising:
a pad configured to receive a pad voltage;
input/output circuitry coupled to the pad and having a first P-type Metal-Oxide-Semiconductor (PMOS) device and a first N-type Metal-Oxide-Semiconductor (NMOS) device, wherein a first current electrode of the first PMOS device is connected to a first current electrode of the first NMOS and to the pad;
a first voltage supply node configured to receive a first supply voltage;
a second voltage supply node configured to receive a second supply voltage different from the first supply voltage;
first selection circuitry configured to, when the I/O buffer is disabled, provide the first supply voltage to a control electrode of the first PMOS device and an N-well of the first PMOS device when the pad voltage is between the first and second supply voltage and to directly provide the pad voltage to the control electrode of the first PMOS device and the N-well of the first PMOS device when the pad voltage is greater than the first supply voltage;
second selection circuitry configured to provide the second supply voltage to a control electrode of the first NMOS device and a P-well of the first NMOS device when the pad voltage is between the first and second supply voltage and to directly provide the pad voltage to the control electrode of the first NMOS device and the P-well of the first NMOS device when the pad voltage is less than the second supply voltage;
first comparison circuitry comprising:
a first voltage divider having:
a second PMOS device having a first current electrode coupled to the first voltage supply node, a second current electrode, and a control electrode coupled to the second current electrode of the second PMOS device, and
a plurality of PMOS devices coupled in series between the second current electrode of the second PMOS device and the second voltage supply node, wherein the first voltage divider is configured to provide a divided voltage based on the first supply voltage at the second current electrode of the second PMOS device when the I/O circuitry is disabled; and
a third PMOS device have a first current electrode coupled to the pad, a control electrode coupled to the second current electrode of the second PMOS device, and a second current electrode configured to provide the third output of the first comparison circuitry when the I/O circuitry is disabled; and
second comparison circuitry comprising:
a second voltage divider having:
a second NMOS device having a first current electrode, a second current electrode coupled to the second voltage supply node, and a control electrode coupled to the second current electrode of the second NMOS device, and
a plurality of NMOS devices coupled in series between the first voltage supply node and the first current electrode of the second NMOS device, wherein the voltage divider is configured to provide a divided voltage based on the first supply voltage at the first current electrode of the second NMOS device; and
a third NMOS device have a first current electrode configured to provide the third output of the second comparison circuitry when the I/O circuitry is disabled, a control electrode coupled to the first current electrode of the second NMOS device, and a second current electrode coupled to the pad.

* * * * *